United States Patent
Siebens et al.

(10) Patent No.: US 8,597,040 B2
(45) Date of Patent: Dec. 3, 2013

(54) DEVICE HAVING AN ELECTRICAL CONNECTOR AND A SACRIFICIAL CAP

(75) Inventors: Larry N. Siebens, Asbury, NJ (US); Dan Gardner, Stewartsville, NJ (US); Geoffrey Reed, East Stroudsburg, PA (US); Jeffrey Gieger, Dingmans Ferry, PA (US); Stanley Szyszko, Wall, NJ (US)

(73) Assignee: Thomas & Betts International, Inc., Wilmington, DE (US)

( * ) Notice: Subject to any disclaimer, the term of this patent is extended or adjusted under 35 U.S.C. 154(b) by 22 days.

(21) Appl. No.: 13/465,756

(22) Filed: May 7, 2012

(65) Prior Publication Data
US 2012/0264321 A1    Oct. 18, 2012

Related U.S. Application Data

(63) Continuation-in-part of application No. 13/038,955, filed on Mar. 2, 2011, now Pat. No. 8,172,596.

(60) Provisional application No. 61/309,919, filed on Mar. 3, 2010.

(51) Int. Cl.
*H01R 13/62*    (2006.01)
(52) U.S. Cl.
USPC ........................................ 439/301
(58) Field of Classification Search
USPC ....................... 439/301–304, 88–89
See application file for complete search history.

(56) References Cited

U.S. PATENT DOCUMENTS

| | | | |
|---|---|---|---|
| 1,902,617 A | 3/1933 | Burr | |
| 2,937,359 A | 5/1960 | Cronin et al. | |
| 3,343,153 A | 9/1967 | Waehner | |
| 3,390,331 A | 6/1968 | Brown et al. | |
| 3,980,374 A | 9/1976 | Fallot | |
| 4,721,355 A * | 1/1988 | Gould | 385/76 |
| 4,760,327 A | 7/1988 | Walsh et al. | |
| 4,794,331 A | 12/1988 | Schweitzer, Jr. | |
| 4,904,932 A | 2/1990 | Schweitzer, Jr. | |
| 4,915,641 A * | 4/1990 | Miskin et al. | 439/247 |
| 4,946,393 A | 8/1990 | Borgstrom et al. | |
| 5,367,251 A | 11/1994 | McTigue | |
| 6,210,206 B1 | 4/2001 | Durham | |
| 6,332,785 B1 | 12/2001 | Muench, Jr. et al. | |
| 6,843,685 B1 | 1/2005 | Borgstrom et al. | |
| 7,150,098 B2 | 12/2006 | Borgstrom et al. | |
| 7,154,281 B2 | 12/2006 | Piesinger | |
| 7,288,718 B2 | 10/2007 | Stepniak et al. | |
| 7,898,356 B2 * | 3/2011 | Sherrer et al. | 333/34 |
| 8,052,350 B2 * | 11/2011 | Roodenburg et al. | 405/166 |
| 2005/0061121 A1 * | 3/2005 | Lauderbaugh | 83/13 |
| 2005/0272294 A1 * | 12/2005 | Ostendorp | 439/301 |
| 2006/0246761 A1 * | 11/2006 | Ostendorp | 439/301 |
| 2009/0029582 A1 * | 1/2009 | Nguyen et al. | 439/301 |
| 2009/0181567 A1 * | 7/2009 | Stockton et al. | 439/271 |

* cited by examiner

*Primary Examiner* — Chandrika Prasad
(74) *Attorney, Agent, or Firm* — Snyder, Clark, Lesch & Chung, LLP

(57) ABSTRACT

A device includes a sacrificial cap configured for mounting on a direct access port of an electrical connector. The sacrificial cap includes an insulated body and a sacrificial probe conductor projecting from the insulated body. The sacrificial probe conductor is configured to conductively couple with a conductor in the electrical connector via the direct access port when the sacrificial cap is installed on the direct access port. The sacrificial cap includes a portion configured to be physically severed to confirm that the electrical connector is de-energized.

21 Claims, 14 Drawing Sheets

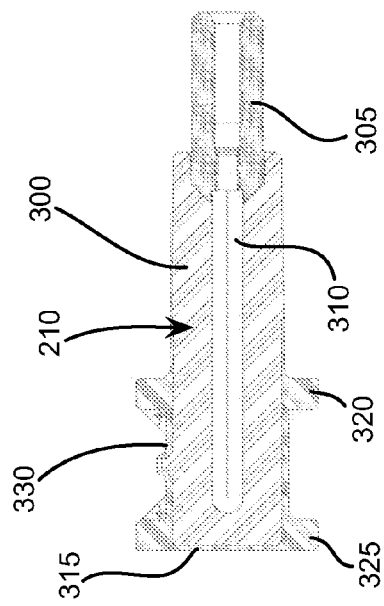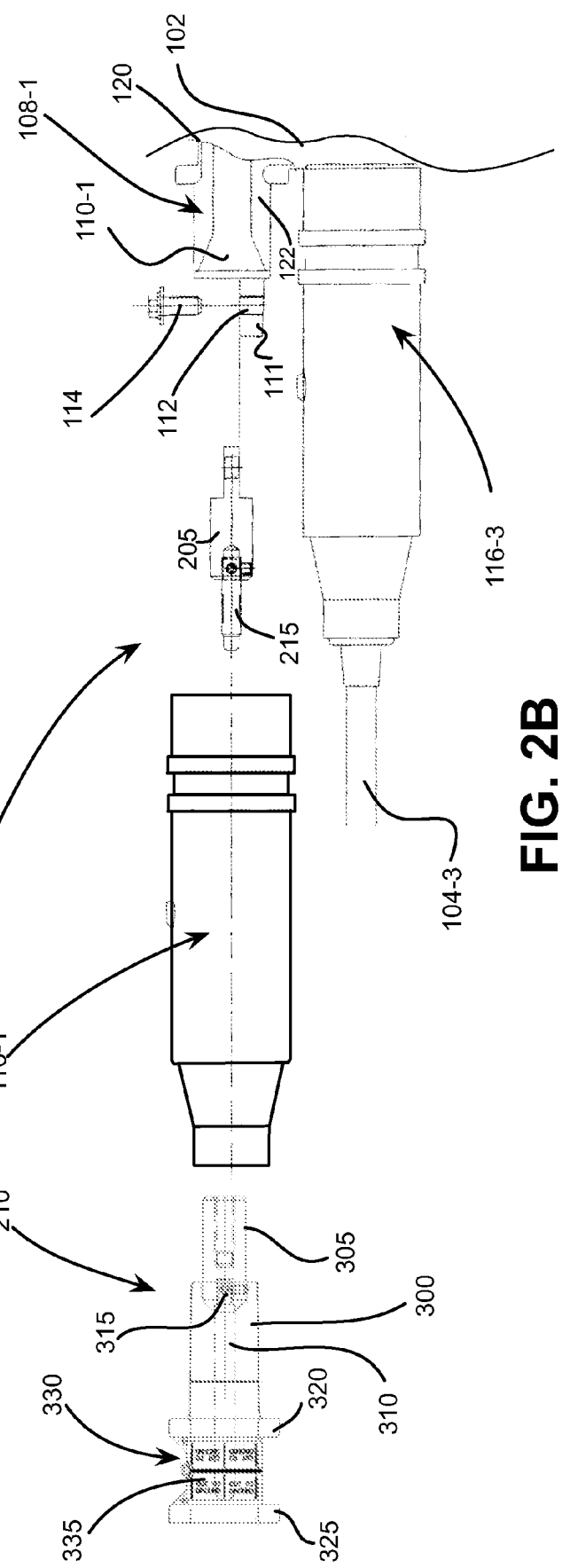

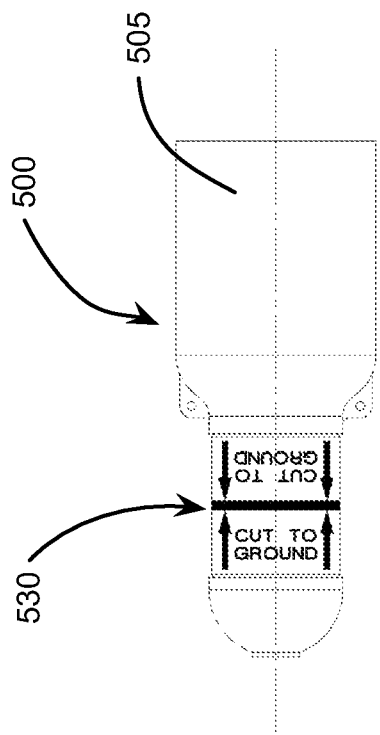
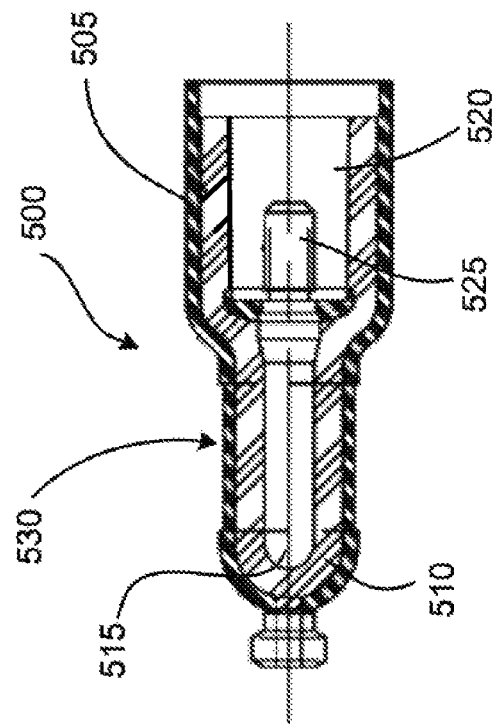
FIG. 5B
FIG. 5A

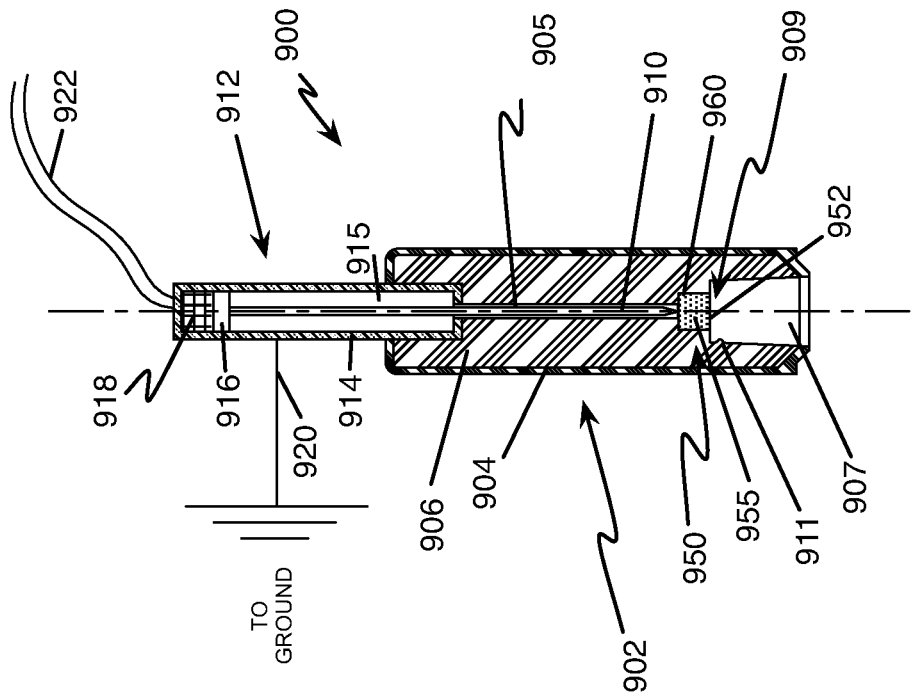
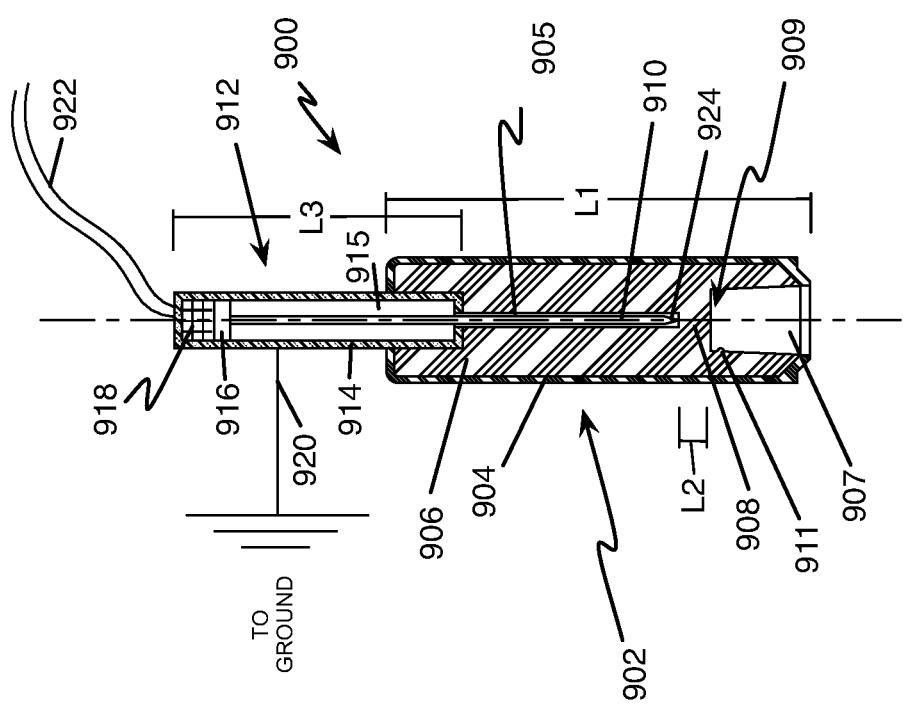
FIG. 9B
FIG. 9A

US 8,597,040 B2

DEVICE HAVING AN ELECTRICAL CONNECTOR AND A SACRIFICIAL CAP

CROSS-REFERENCE TO RELATED APPLICATIONS

This application is a continuation-in-part application of and claims priority to U.S. patent application Ser. No. 13/038,955, filed Mar. 2, 2011, which is a non-provisional application claiming priority under 35. U.S.C. §119, based on U.S. Provisional Patent Application No. 61/309,919 filed Mar. 3, 2010, the disclosures of which are hereby incorporated by reference herein.

BACKGROUND OF THE INVENTION

The present invention relates to electrical cable connectors, such as splicing connectors for joining two or more electrical cables, loadbreak connectors, and deadbreak connectors. More particularly, aspects described herein relate to an electrical cable connector that includes a feature for enabling personnel to ensure that the connector is de-energized.

High and medium voltage electrical connectors and components typically operate in the 15 to 35 kilovolt (kV) range. Because such voltages are potentially very dangerous, it is typically necessary for personnel to confirm that the power is disconnected before commencing work or repair. Known methods of visual or physical de-energizing confirmation include "spiking the cable," in which a grounded spike is driven thru the cable and into the conductor or a grounded hydraulic cable cutter is used to physically cut the cable in half.

Unfortunately, after a cable is "spiked," the utility is required to replace the cable or increase its length by adding a splice and additional cable in order to reconnect to the system. This is costly and time consuming.

BRIEF DESCRIPTION OF THE DRAWINGS

FIG. 2B illustrates the power cable splicing connector of FIG. 2A in an exploded (e.g., unassembled) view;

FIG. 3 is a cross-sectional view of the sacrificial adapter of FIGS. 2A and 2B;

FIG. 5A is a cross-sectional view of an alternative sacrificial appendage for use with the splicing connector of FIGS. 4A and 4B;

FIG. 5B is side view of the alternative sacrificial appendage of FIG. 5A;

FIG. 9A is an exploded, schematic, cross-sectional diagram illustrating still another exemplary sacrificial assembly consistent with implementations described herein;

FIG. 9B is a cross-sectional diagram of another embodiment of the sacrificial assembly of FIG. 9A.

DETAILED DESCRIPTION OF THE PREFERRED EMBODIMENTS

The following detailed description refers to the accompanying drawings. The same reference numbers in different drawings may identify the same or similar elements.

Figure 1A:
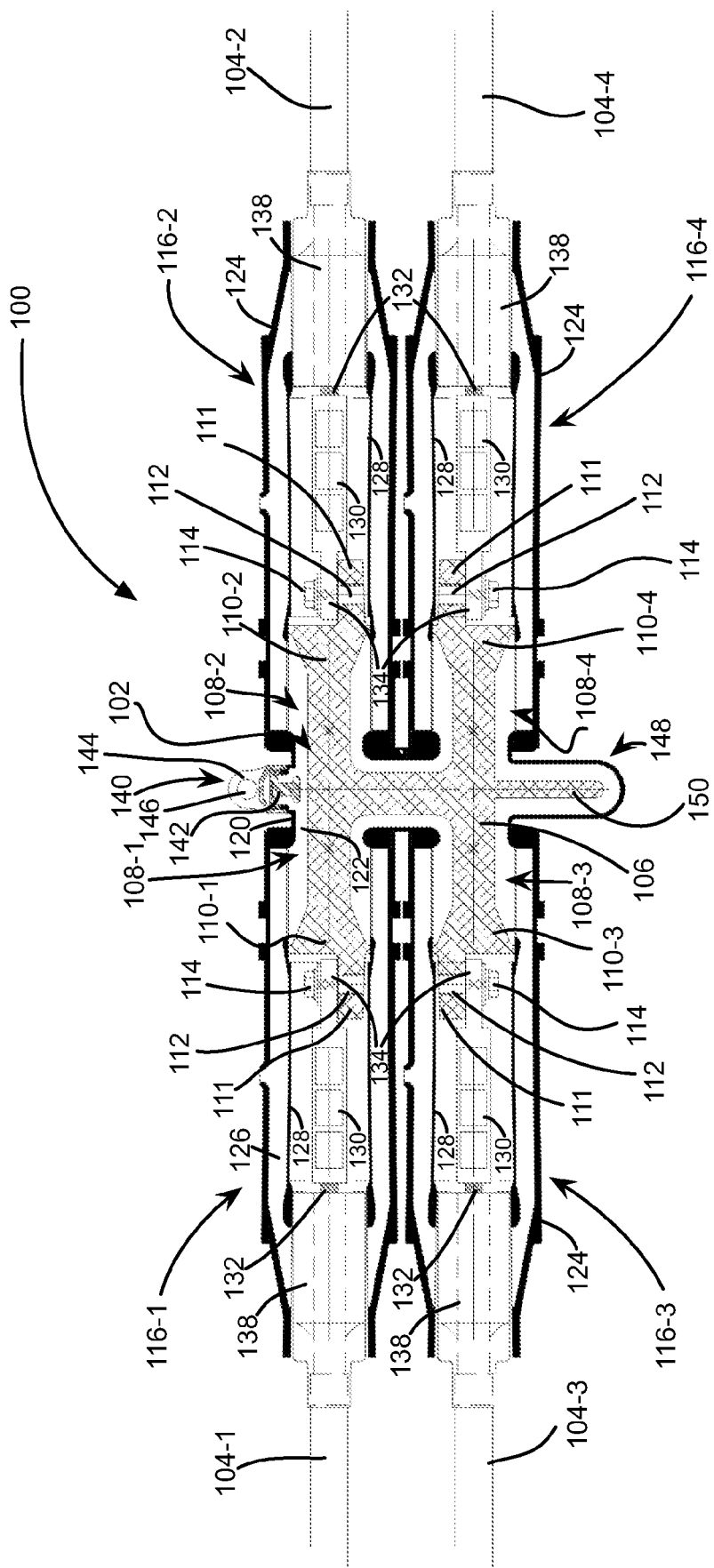
FIG. 1A is a schematic cross-sectional diagram illustrating a power cable splicing connector consistent with implementations described herein.

FIG. 1A is a schematic cross-sectional diagram illustrating a power cable splicing connector 100 configured in a manner consistent with implementations described herein. As shown in FIG. 1, power cable splicing connector 100 may include a four-way yoke 102 for enabling connection of power cables 104-1, 104-2, 104-3, and 104-4 (collectively "power cables 104," and individually "power cable 104-$x$"). For example, power cable 104-1 may be a supply cable and cables 104-2 to 104-4 may be load cables. Other types of power cable splicing connectors may be configured in accordance with implementations described herein, such as three-way yoke connectors, two-way connectors, etc.

In one implementation, yoke 102 of power cable splicing connector 100 may include a central conductor 106 and number of splice openings 108-1 to 108-4 (collectively "splice openings 108," and individually "splice opening 108-$x$"). Central conductor 106 may be formed of a suitably conductive material, such as copper, aluminum, or other conductive alloy. Further, as shown in FIG. 1, central conductor 106 may include outwardly extending portions 110-1 to 110-4 (collectively "outwardly extending portion 110," and individually "outwardly extending portion 110-$x$") that project from respective splice openings 108-$x$. As described in additional detail below, central conductor 106 may connect each of power cables 104-$x$ to each other power cable 104-$x$, such that voltage applied to one cable is transferred to each other cable.

Outwardly extending portions 110 may be configured to receive connector portions of power cables 104. For example, each extending portion 110-$x$ may include a spade portion 111 having a threaded bore 112 therein for receiving a connector bolt 114. In one configuration, as illustrated in FIG. 1, outwardly extending portion 110-1 extends oppositely from outwardly extending portion 110-2 and outwardly extending portion 110-3 extends oppositely from outwardly extending portion 110-4. Furthermore, outwardly extending portions 110-1 and 110-2 may be oriented parallel to outwardly extending portions 110-3 and 110-4, respectively. Such a configuration may provide for compact splicing or splitting of a power supply cable (e.g., cable 104-1) to multiple load cables (e.g., cables 104-2 to 104-4).

As shown in FIG. 1A, each splice opening 108-x includes a cable receptacle interface that includes a substantially cylindrical flange or cuff portion configured to frictionally engage a cable receptacle 116-x (individually, cable receptacle 116-x, or collectively, cable receptacles 116). For example, an inside diameter of a forward end of cable receptacle 116-x may be sized to frictionally engage the cuff portion of splice opening 108-x. Each cable receptacle 116 be substantially cylindrical and may be configured to surround and protect an interface between power cables 104 and extending portions 110.

Yoke 102 may include an outer shield 120 formed from, for example, a peroxide-cured synthetic rubber, commonly referred to as EPDM (ethylene-propylene-dienemonomer). Within shield 120, yoke 102 may include an insulative inner housing 122, typically molded from an insulative rubber or epoxy material. Central conductor 106 may be enclosed within insulative inner housing 122.

Regarding cable receptacles 116, each cable receptacle 116-x may include an EPDM outer shield 124 and an insulative inner housing 126, typically molded from an insulative rubber or epoxy material. Cable receptacle 116-x further includes a conductive or semi-conductive insert 128 having a bore therethrough. Upon assembly, cable receptacle 116 surrounds the interface between power cable 104-x and extending portion 110-x. In one implementation, a forward end of insert 128 may be configured to frictionally engage outwardly extending portion 110-x of central conductor 106 upon assembly of splicing connector 100, thereby ensuring the electrical integrity of splicing connector 100.

Referring to power cables 104, a forward end of each power cable 104-x may be prepared by connecting power cable 104 to a crimp connector 130. Crimp connector 130 may include a substantially cylindrical assembly configured to receive a cable conductor 132 of power cable 104-x therein. During preparing of power cable 104-x, a portion of crimp connector 130 may be physically deformed (e.g., crimped) to fasten crimp connector 130 to cable conductor 132. Crimp connector portion 130 may include a forward spade portion 134 configured to be securely fastened to a spade portion 111 of outwardly extending portion 110-x of central conductor 106. For example, forward spade portion 134 may include a bore (not shown) configured to align with bore 112 in spade portion 111. Connector bolt 114 may be inserted through the bore and into threaded bore 112 during assembly of splice connector 100.

As shown in FIG. 1A, each of the prepared power cables 104 may further include an adapter 138 disposed rearwardly relative to crimp connector 130. Adapter 138 may be affixed to power cable 104-x and may provide a frictional engagement with a rearward portion of cable receptacle 116-x. In one implementation, adapter 138 may be formed of an insulative material, such as rubber or epoxy.

In one exemplary implementation, power cable splicing connector 100 may include a voltage detection test point assembly 140 for sensing a voltage in splicing connector 100. Voltage detection test point assembly 140 may be configured to allow an external voltage detection device, to detect and/or measure a voltage associated with splicing connector 100.

For example, as illustrated in FIG. 1A, voltage detection test point assembly 140 may include a test point terminal 142 embedded in a portion of yoke inner housing 122 and extending through an opening within yoke outer shield 120. In one exemplary embodiment, test point terminal 142 may be formed of a conductive metal or other conductive material. In this manner, test point terminal 142 may be capacitively coupled to the electrical conductor elements (e.g., central conductor 106) within splicing connector 100.

Consistent with implementations described herein, a test point cap 144 may sealingly engage portion test point terminal 142 and outer shield 120. In one implementation, test point cap 144 may be formed of a semi-conductive material, such as EPDM compounded with conductive additives. When test point terminal 142 is not being accessed, test point cap 144 may be mounted on test point assembly 140. Because test point cap 144 is formed of a conductive or semi-conductive material, test point cap 144 may ground the test point when in position. Test point cap 144 may include an aperture 146 for facilitating removal of test point cap 144, e.g., using a hooked lineman's tool.

Consistent with implementations described herein, yoke 102 may include a sacrificial appendage 148 projecting therefrom. As shown in FIG. 1A, sacrificial appendage 148 may include a sacrificial conductor extension 150 projecting from central conductor 106. Portions of insulative inner housing 122 and outer housing 120 may be formed around sacrificial conductor extension 150. In one implementation, sacrificial appendage 148 may project substantially perpendicularly from outwardly extending portions 110, so as to be relatively free of encumbrances.

When it is necessary for work to be performed on any of power cables 104 (or devices connected to power cables 104), a worker may cut through sacrificial appendage 148 (e.g., with a hydraulic cable cutter, or similar tool) to ensure that the electrical system that splicing connector 100 is connected to has been properly de-energized and is, therefore, safe to work on. When it is time to re-energize splicing connector 100, yoke 102 may be replaced with a new yoke 102, having an intact sacrificial appendage 148.

Figure 1B:
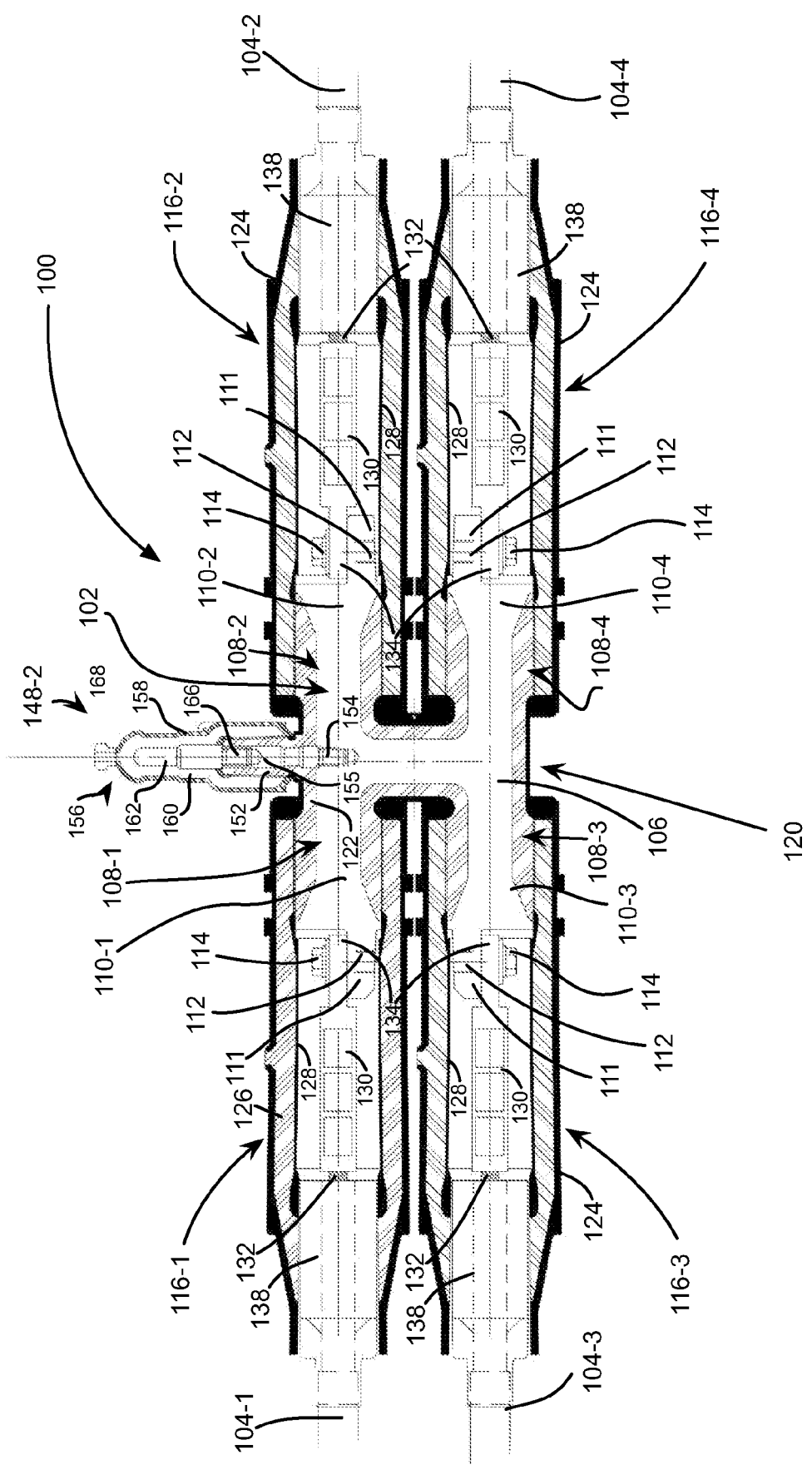
FIG. 1B is a schematic partial cross-sectional diagram illustrating a power cable splicing connector configured in a manner consistent with another implementation described herein.
Figure 1C:
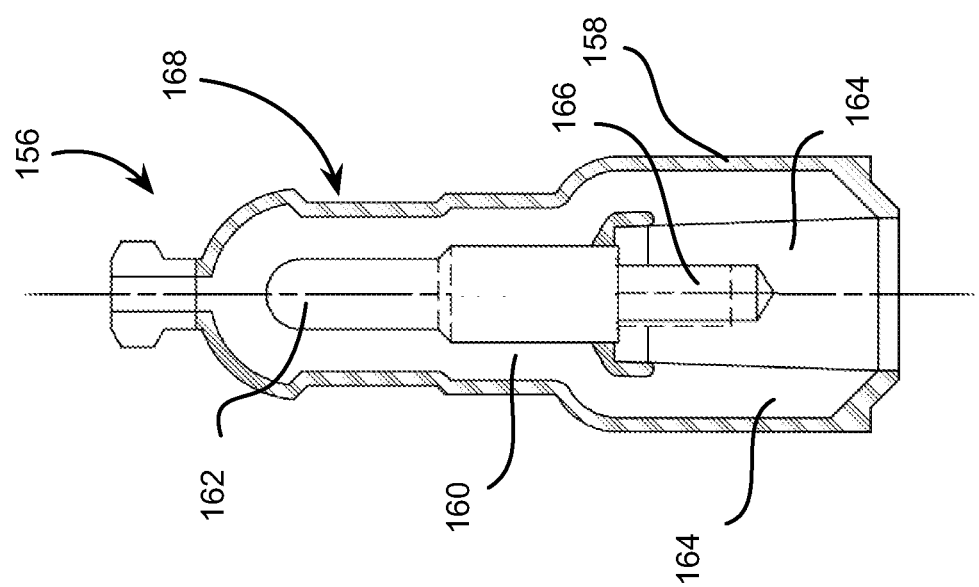
FIG. 1C is a cross-sectional diagram of the sacrificial cap of FIG. 1B.

FIG. 1B is a schematic partial cross-sectional diagram illustrating power cable splicing connector 100 configured in a manner similar to that described above with respect to FIG. 1A. FIG. 1C is a partial cross-sectional diagram illustrating the sacrificial cap of FIG. 1B. Where appropriate, FIGS. 1B and 1C use the same reference numbers to identify the same or similar elements.

As shown in FIGS. 1B and 1C, yoke 102 and the portions of cable splicing connector 100 associated with power cables 104-2 to 104-4 remain substantially similar to the embodiment describe above with respect to FIG. 1A. However, unlike the embodiment of FIG. 1A, sacrificial appendage 148 (referred to as element 148-2 in FIGS. 1B and 1C) may include a modular configuration configured for removable attachment and/or replacement on yoke 102.

As shown in FIG. 1B, yoke 102 may include a sacrificial appendage connection portion 152 projecting outwardly therefrom. In one implementation, sacrificial appendage connection portion 152 may be integrally formed with inner housing 122 and may include a contact 154 provided therein. Contact 154 may extend into a corresponding portion of central conductor 106, such as via a threaded bore provided in central conductor 106. Contact 154 may include a female thread 155 at an outer end thereof for receiving a sacrificial cap 156.

As shown in FIGS. 1B and 1C, sacrificial cap 156 may include an EPDM outer shield 158 and an insulative inner housing 160, typically molded from an insulative rubber or epoxy material. Sacrificial cap 156 may further include a sacrificial conductor 162 received within a rearward portion of inner housing 160. Furthermore, a forward portion of sacrificial cap 156 may include a cavity 164 therein (shown in FIG. 1C) for engaging a projecting portion of sacrificial appendage connection portion 152.

A forward portion of outer shield 158 and inner housing 160 may be configured to surround and protect an interface between sacrificial appendage connection portion 152 and sacrificial conductor 162. In one implementation, a forward end of outer shield 158 and inner housing 160 may be configured to frictionally engage a stepped or notched outer configuration of sacrificial appendage connection portion 152 upon assembly of splicing connector 100, thereby ensuring the electrical integrity of splicing connector 100.

Consistent with implementations described herein, sacrificial conductor 162 may include a conductive threaded male protrusion 166 extending axially therefrom. As described above, the projecting portion of contact 154 may include threaded female cavity 155. Male protrusion 166 may correspond to threaded female portion 155 in contact 154 to couple contact 154 to sacrificial conductor 162, thereby conductively connecting sacrificial conductor 162 to central conductor 106 of yoke 102. In other implementations, the male/female relationship may be reversed.

In one implementation, a cut-through region 168 may be provided in an outer portion of sacrificial cap 156 in a region overlying at least a portion of sacrificial conductor 162. In some implementations, indicia relating to cut-through region 168 may be provided on a surface of outer housing 158 for indicating that a user is to cut through sacrificial cap 156 at cut-through region 168.

When it is necessary for work to be performed on any of power cables 104 (or devices connected to power cables 104), a worker may cut through sacrificial cap 156 at cut-through region 168 (e.g., with a grounded hydraulic cable cutter, or similar tool) to ensure that electrical the system that splicing connector 100 is connected to has been properly de-energized and is, therefore, safe to work on. When it is time to reenergize splicing connector 100, the cut-through sacrificial cap 156 may be removed and a new or replacement sacrificial cap 156 may be installed.

Figure 2A:
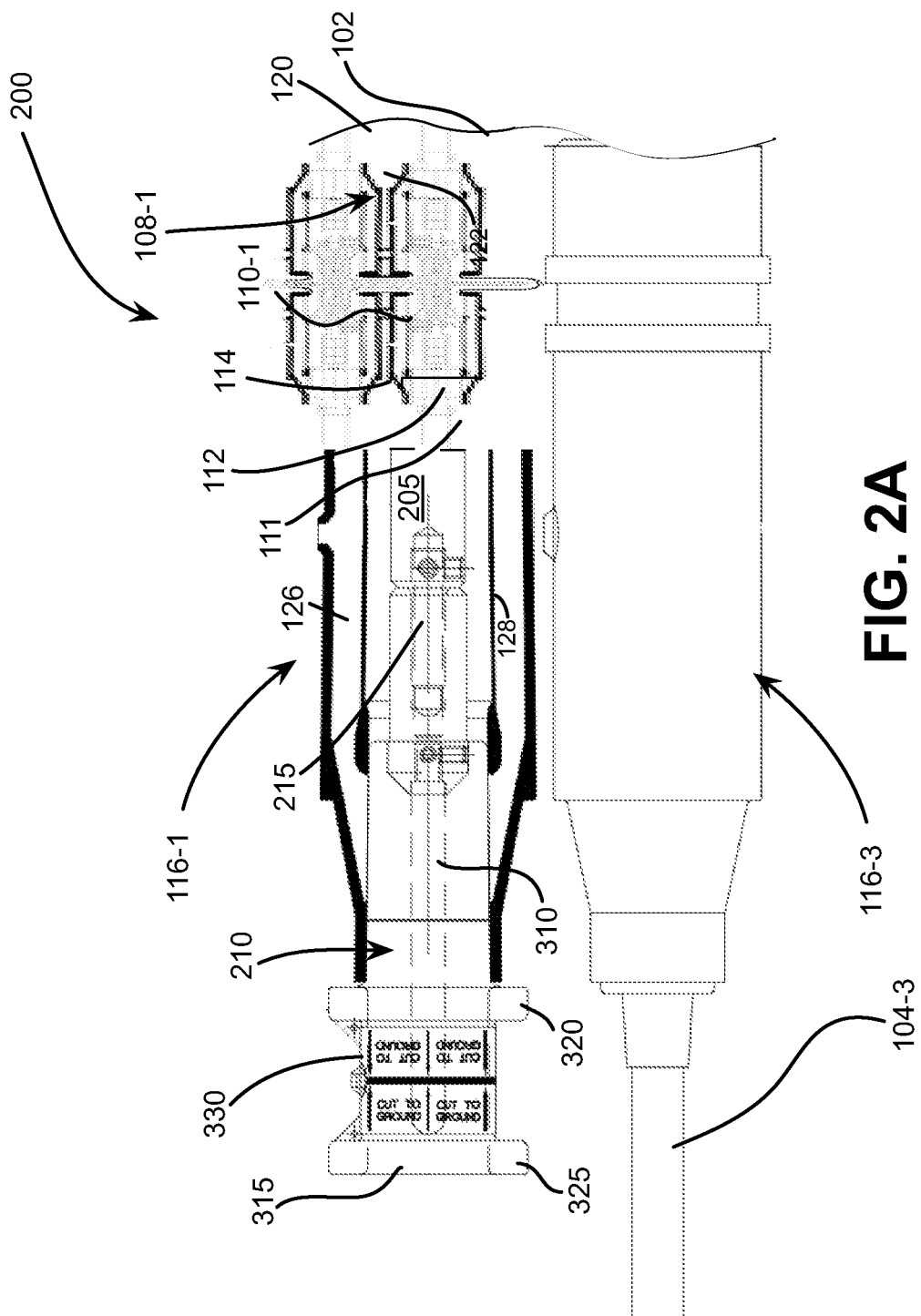
FIG. 2A is a schematic partial cross-sectional diagram illustrating a power cable splicing connector configured in a manner consistent with another implementation described herein.

FIG. 2A is a schematic partial cross-sectional diagram illustrating a power cable splicing connector 200 configured in a manner consistent with another implementation described herein. FIG. 2B illustrates power cable splicing connector 200 in an exploded (e.g., unassembled) view. Where appropriate, FIGS. 2A and 2B use the same reference numbers to identify the same or similar elements.

As shown in FIGS. 2A and 2B, yoke 102 and the portions of cable splicing connector 200 associated with power cables 104-2 to 104-4 remain substantially similar to the embodiment describe above with respect to FIG. 1A. However, unlike the embodiment of FIG. 1A, yoke 102 does not include a sacrificial appendage (e.g., appendage 148) extending therefrom. Rather, as described below, one of splice openings 108-1 to 108-4 (e.g., splice opening 108-1) and the corresponding outwardly extending portion 110 (e.g., extending portion 110-1) may be used to provide a sacrificial appendage or portion to splicing connector 200.

As shown in FIGS. 2A and 2B, a sacrificial adapter spade connector 205 may be connected to spade portion 111 of outwardly extending portion 110-1 via connector bolt 114. Sacrificial adapter spade connector 205 may be configured to provide a releasable attachment mechanism for connecting sacrificial adapter 210 to yoke 102. For example, sacrificial adapter spade connector 205 may include a conductive threaded male protrusion 215 extending axially therefrom in a rearward direction. As described below, sacrificial adapter 210 may include a correspondingly threaded female cavity for conductively securing sacrificial adapter 210 to male protrusion 215. In other implementations, the male/female relationship may be reversed. For example, sacrificial adapter spade connector 205 may include a female threaded cavity for receiving threaded male protrusion 215 extending from sacrificial adapter 210.

As shown in FIGS. 2A and 2B, cable receptacle 116-1 may surround spade extending portion 110-1, spade portion 111, and sacrificial adapter spade connector 205 in a manner similar to that described above with respect to FIG. 1A. For example, cable receptacle 116-1 be substantially cylindrical and may be configured to surround and protect an interface between power sacrificial cable adapter connector 205 and extending portion 110-1. Further, forward end of insert 128 in receptacle 116-1 may be configured to frictionally engage outwardly extending portion 110-1 upon assembly of splicing connector 200, thereby ensuring the electrical integrity of splicing connector 200.

FIG. 3 is a cross-sectional view of sacrificial adapter 210. As shown, sacrificial adapter 210 may have a substantially cylindrical configuration that includes an insulative adapter housing 300, a connector portion 305, a sacrificial bar 310, and a semi-conductive jacket 315. Insulative adapter housing 300 may be formed of, for example, EPDM and may be sized to frictionally engage rearward openings in outer shield 124 and inner insert 128 of cable receptacle 116-1.

Insulative adapter housing 300 may axially surround sacrificial bar 310 and a rearward portion of connector portion 305 so that, upon assembly, sacrificial bar 310 is electrically connected to central conductor 106 of yoke 102 (e.g., via sacrificial adapter spade connector 205). As described briefly above, connector portion 305 may include a threaded cavity therein for receiving threaded male protrusion 215 extending from sacrificial adapter spade connector 205.

Semi-conductive jacket 315 may be formed about a rearward portion of insulative adapter housing 300, such that a portion of sacrificial adapter 210 extending from cable receptacle 116-1 is encased in semi-conductive jacket 315, thereby ensuring electrical continuity on an outer surface of splicing connector 200. As shown in FIGS. 2A-3, semi-conductive jacket 315 may include forward and rearward annular shoulder portions 320 and 325, and a central cut-through portion 330.

In one implementation, forward and rearward annular shoulder portions 320/325 may radially project from a central axis of sacrificial adapter 210 and may provide a means with which to insert sacrificial adapter 210 into cable receptacle 116-1. In addition, as shown in FIG. 2A, forward annular shoulder portion 320 may provide a stop against receptacle 116-1, cut-through portion 330 may be provided in a region between forward annular shoulder portion 320 and rearward annular shoulder portion 325 and may be provided in a region overlying at least a portion of sacrificial bar 310. In some implementations, cut-through portion 330 may be provided with indicia 335 for indicating that a user is to cut through sacrificial adapter 210 at cut-through portion 330.

When it is necessary for work to be performed on any of power cables 104 (or devices connected to power cables 104), a worker may cut through sacrificial adapter 210 at cut-through portion 330 (e.g., with a grounded hydraulic cable cutter, or similar tool) to ensure that the electrical system that splicing connector 200 is connected to has been properly de-energized and is, therefore, safe to work on. When it is time to re-energize splicing connector 200, the cut-through sacrificial adapter 210 may be removed and a new or replacement sacrificial adapter 210 may be installed.

Figure 4A:
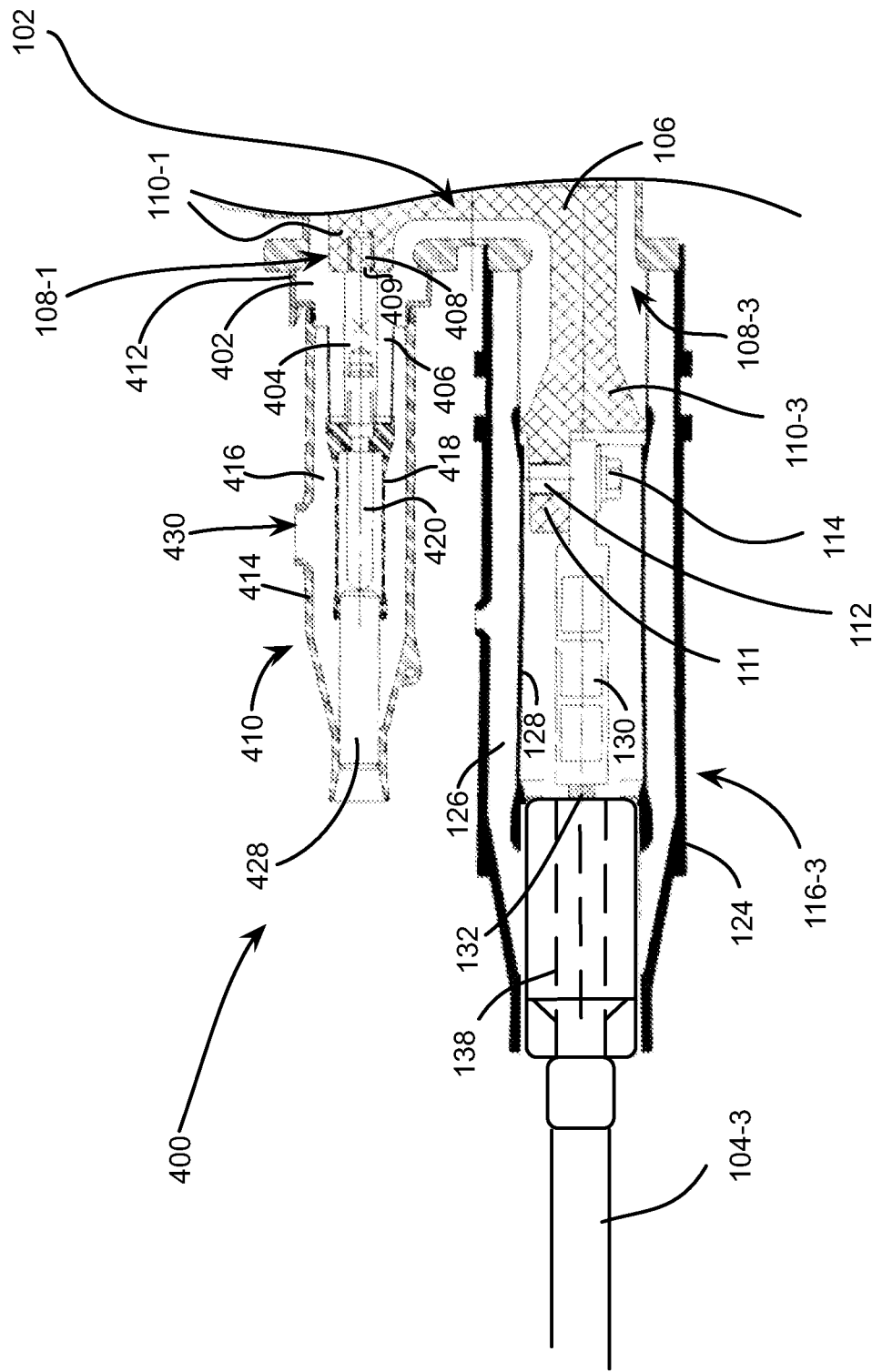
FIG. 4A is a schematic partial cross-sectional diagram illustrating a power cable splicing connector configured in a manner consistent with yet another implementation described herein.
Figure 4B:
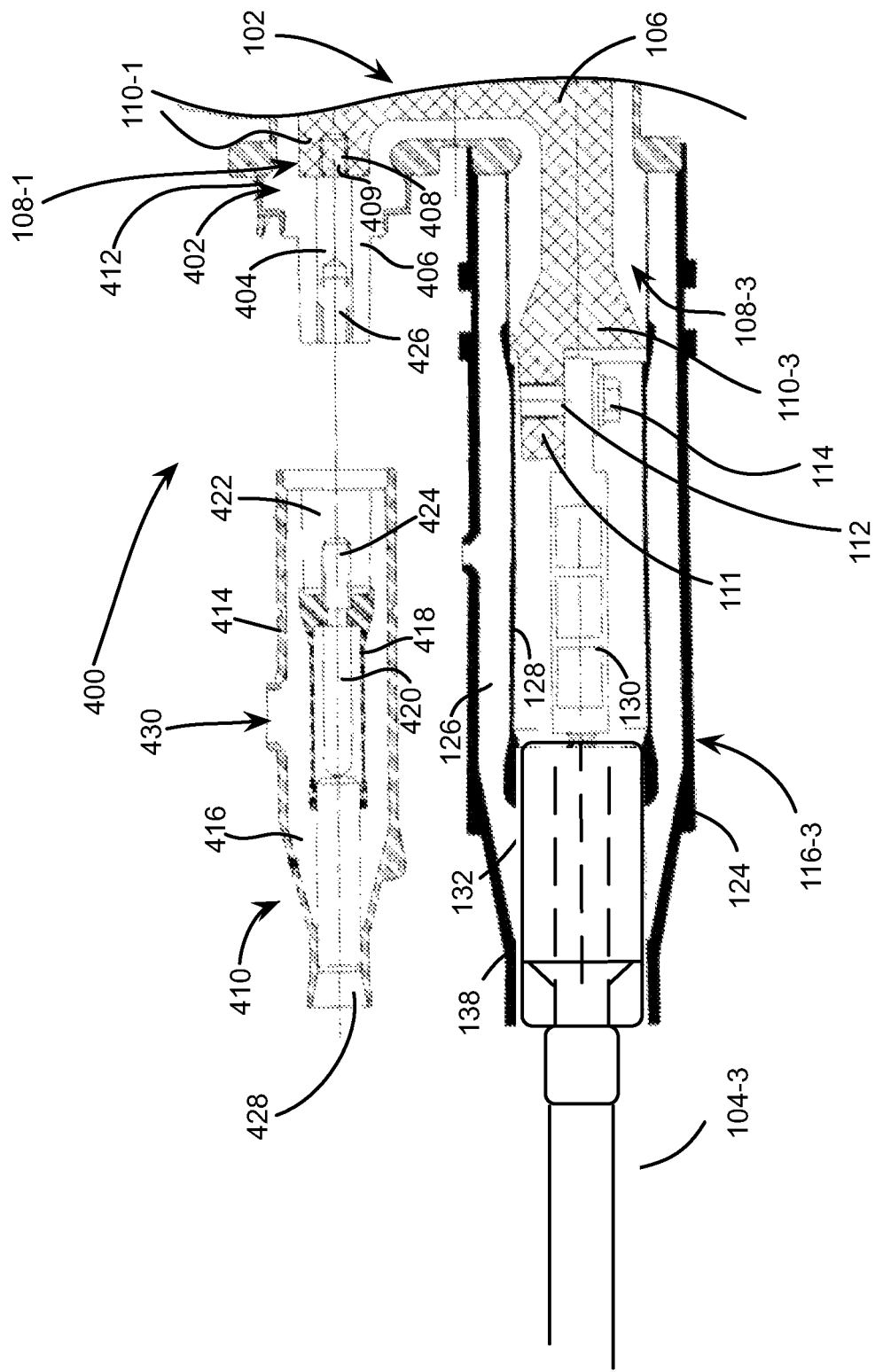
FIG. 4B illustrates the power cable splicing connector of FIG. 4A in an exploded (e.g., unassembled) view.

FIG. 4A is a schematic partial cross-sectional diagram illustrating a power cable splicing connector 400 configured in a manner consistent with yet another implementation described herein. FIG. 4B illustrates power cable splicing connector 400 in an exploded (e.g., unassembled) view. Where appropriate, FIGS. 4A and 4B use the same reference numbers to identify the same or similar elements.

As shown in FIGS. 4A and 4B, yoke 102 and the portions of cable splicing connector 400 associated with power cables 104-2 to 104-4 remain substantially similar to the embodiment described above with respect to FIG. 1A. However, unlike the embodiment of FIG. 1A, yoke 102 does not include a sacrificial appendage extending therefrom. Rather, as described below, one of splice openings 108-1 to 108-4 (e.g., splice opening 108-1) and the corresponding outwardly extending portion 110 (e.g., extending portion 110-1) may be used to provide a sacrificial portion for splicing connector 200.

As shown in FIGS. 4A and 4B, outwardly extending portion 110-1 may include a sacrificial interface 402 connected thereto. Sacrificial interface 402 may include a conductor portion 404 and an insulative portion 406. In one implementation, conductor portion 404 may be conductively coupled to extending portion 110-1, such as via a threaded engagement between conductor portion 404 and outwardly extending portion 110-1 of central conductor 106. For example, extending portion 110-1 may be provided with a female threaded cavity 408 and a forward portion of conductor portion 404 of sacrificial interface 402 may be provided with a corresponding male threaded portion 409. In other implementations, the male/female relationship may be reversed.

Insulative portion 406 of sacrificial interface 402 may radially surround conductor portion 404. As shown, in one implementation, insulative portion 406 may include a stepped outer configuration for sealingly receiving a sacrificial receptacle 410 secured thereon. In one implementation, insulative portion 406 of sacrificial interface 402 may include an outer shield 412 formed from, for example, EPDM.

As shown in FIGS. 4A and 4B, sacrificial receptacle 410 may be configured for releasable and replaceable attachment to yoke 102 following a sacrificial use, as described below. In one implementation, sacrificial receptacle 410 may be based on a non-sacrificial receptacle re-purposed from other products (e.g., 200 Amp deadbreak equipment, etc.). In this manner, a cost savings in manufacturing sacrificial receptacle 410 may be realized.

Sacrificial receptacle 410 may include an EPDM outer shield 414 and an insulative inner housing 416, typically molded from an insulative rubber or epoxy material. Sacrificial receptacle 410 may further include a conductive or semi-conductive insert 418 having a bore formed therethrough. As shown, semi-conductive insert 418 may be configured to receive and surround a sacrificial conductor 420 therein. Furthermore, a forward portion of sacrificial receptacle 410 may include a cavity 422 therein for engaging a rearward portion of sacrificial interface 402.

A forward portion of outer shield 414 and inner housing 416 may be configured to surround and protect an interface between sacrificial interface 402 and sacrificial conductor 420. In one implementation, a forward end of outer shield 414 and inner housing 416 may be configured to frictionally engage the stepped outer configuration of sacrificial interface 402 upon assembly of splicing connector 400, thereby ensuring the electrical integrity of splicing connector 400.

Consistent with implementations described herein, sacrificial conductor 420 may include a conductive threaded male protrusion 424 extending axially therefrom in a forward direction. A rearward portion of sacrificial interface 402 may include a correspondingly threaded female cavity 426 for conductively securing sacrificial interface 402 to sacrificial conductor 420, thereby connecting sacrificial conductor 420 to central conductor 106 of yoke 102. In other implementations, the male/female relationship may be reversed.

A rearward portion of sacrificial receptacle 410 (e.g., the rearward end of the bore semi-conductive insert 418) may be configured to receive an insulative plug 428 therein. As described above, in some implementations, sacrificial receptacle 410 may be re-purposed from an existing receptacle in which the rearward end of the bore is configured for receiving a power cable or other element therein. Because sacrificial receptacle 410 does not connect to a power cable, insulative plug 428 may be provided to effectively seal the opening within the rearward end of sacrificial receptacle 410.

In one implementation, a cut-through region 430 may be provided in an outer surface of sacrificial receptacle 410 in a region overlying at least a portion of sacrificial conductor 420. In some implementations, cut-through region 430 may be provided with indicia for indicating that a user is to cut through sacrificial receptacle 410 at cut-through region 430.

When it is necessary for work to be performed on any of power cables 104 (or devices connected to power cables 104), a worker may cut through sacrificial receptacle 410 at cut-through region 430 (e.g., with a grounded hydraulic cable cutter, or similar tool) to ensure that the electrical system that splicing connector 400 is connected to has been properly de-energized and is, therefore, safe to work on. When it is time to re-energize splicing connector 400, the cut-through sacrificial receptacle 410 may be removed and a new or replacement sacrificial receptacle 410 may be installed.

FIGS. 5A and 5B are cross-section and side views, respectively, of an alternative sacrificial appendage 500 used as an alternative to sacrificial receptacle 410 of FIGS. 4A and 4B. Unlike the embodiment of FIGS. 4A and 4B, sacrificial appendage 500 is not a re-purposed cable receptacle or interface element.

As in the embodiment of FIGS. 4A and 4B, insulative portion 406 of sacrificial interface 402 may include a stepped outer configuration for sealingly receiving sacrificial appendage 500 secured thereon. Sacrificial appendage 500 may be configured for releasable and replaceable attachment to yoke 102 following a sacrificial use, as described below.

Sacrificial appendage 500 may include an EPDM outer shield 505 and an insulative inner housing 510, typically molded from an insulative rubber or epoxy material. Sacrificial appendage 500 may further include a sacrificial conductor 515 received within a rearward portion of inner housing 510. Furthermore, a forward portion of sacrificial appendage 500 may include a cavity 520 therein for engaging a rearward portion of sacrificial interface 402.

A forward portion of outer shield 505 and inner housing 510 may be configured to surround and protect an interface between sacrificial interface 402 and sacrificial conductor 515. In one implementation, a forward end of outer shield 505 and inner housing 510 may be configured to frictionally engage the stepped outer configuration of sacrificial interface 402 upon assembly of splicing connector 400, thereby ensuring the electrical integrity of splicing connector 400.

Consistent with implementations described herein, sacrificial conductor 515 may include a conductive threaded male protrusion 525 extending axially therefrom in a forward direction relative to a remainder of sacrificial conductor 515. As described above, rearward portion of sacrificial interface 402 may include threaded female cavity 426 for conductively securing sacrificial interface 402 to male protrusion 525 of sacrificial conductor 515, thereby connecting sacrificial conductor 515 to central conductor 106 of yoke 102. In other implementations, the male/female relationship may be reversed.

In one implementation, a cut-through region 530 may be provided in a rearward portion of sacrificial appendage 500 in a region overlying at least a portion of sacrificial conductor 515. In some implementations, indicia relating to cut-through region 530 may be provided on a surface of outer housing 515 for indicating that a user is to cut through sacrificial appendage 500 at cut-through region 530.

When it is necessary for work to be performed on any of power cables 104 (or devices connected to power cables 104), a worker may cut through sacrificial appendage 500 at cut-through region 530 (e.g., with a grounded hydraulic cable cutter, or similar tool) to ensure that electrical the system that splicing connector 400 is connected to has been properly de-energized and is, therefore, safe to work on. When it is time to reenergize splicing connector 400, the cut-through sacrificial appendage 500 may be removed and a new or replacement sacrificial appendage 500 may be installed.

Figure 6A:
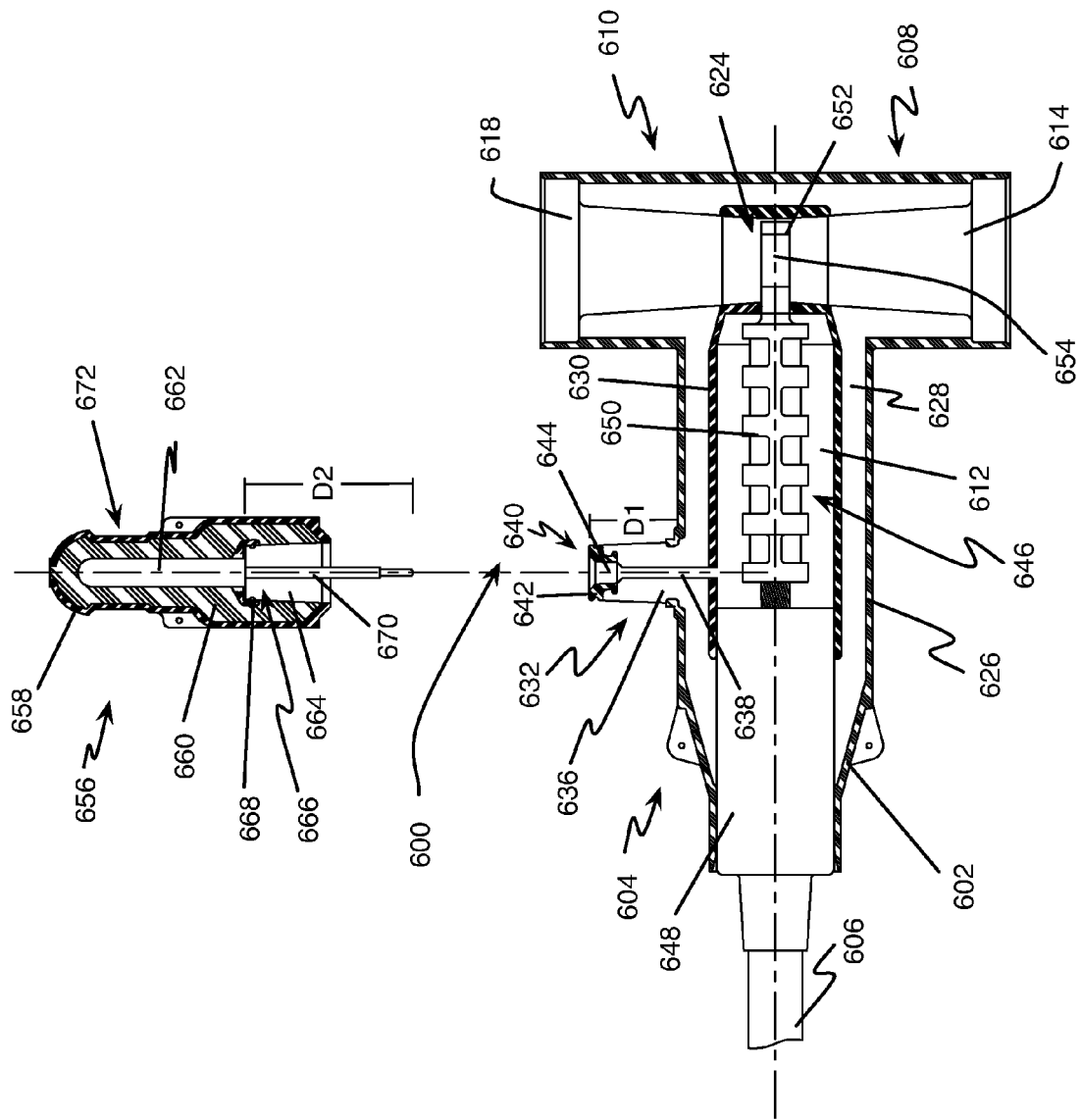
FIG. 6A is an exploded, schematic, cross-sectional diagram illustrating a power cable elbow connector consistent with implementations described herein.

FIG. 6A is an unassembled or exploded, schematic, cross-sectional diagram illustrating a power cable elbow connector 600 consistent with implementations described herein. As shown, power cable elbow connector 600 may include a main housing body 602 that includes a conductor receiving end 604 for receiving a power cable 606 therein and first and second T-ends 608/610.

Conductor receiving end 604 may extend along a main axis of connector 600 and may include a bore 612 extending therethrough. First and second T-ends 608/610 may project substantially perpendicularly from conductor receiving end 604 in opposing directions from one another. For example, first T-end 608 is downwardly positioned and includes a bore 614 therein for receiving an equipment bushing, such as a deadbreak or loadbreak transforming bushing or other high or medium voltage terminal. Second T-end 610 is upwardly positioned and includes a bore 618 therein and may be configured to receive an equipment fitting, such as an insulating plug, a grounding plug, or another elbow connector. A contact area 624 may be formed at the confluence of bores 612, 614, and 618.

Power cable elbow connector 600 may include an electrically conductive outer shield 626 formed from, for example, EPDM. Within shield 626, power cable elbow connector 600 may include an insulative inner housing 628, typically molded from an insulative rubber or epoxy material. Within insulative inner housing 628, power cable elbow connector 600 may include a conductive or semi-conductive insert 630 that surrounds the connection portion of power cable 606.

Consistent with embodiments described herein, power cable elbow connector 600 may include a direct access interface port 632 that provides a direct port to a conductor of power cable 606 and bore 612 in conductor receiving end 604. As described below, direct access interface port 632 may be configured to allow an external sacrificial component to directly engage and interface with a conductor of power cable 606.

For example, as illustrated in FIG. 6A, direct access port 632 may include a projection region 636 that projects substantially perpendicularly from the main axis of conductor receiving end 604 in a region that overlies at least a portion of power cable 606. As shown, projection region 636 may be formed integral with insulative inner housing 628 and may extend through an opening within outer shield 626. In some implementations, projection region 636 may be frustoconically shaped to provide for a frictional engagement with an attached accessory, as described below. In other implementations, projection region 636 may be substantially cylindrical.

As shown in FIG. 6A, projection region 636 may include a bore 638 therethrough that communicates with bore 612 in conductor receiving end 604. Inner insert 630 may include an opening that corresponds with bore 612 to provide access to bore 612. As described below, bore 638 may allow a contact probe to extend into bore 612 and come into contact with a conductor of power cable 606.

An upper surface of projection region 636 may include a ribbed engagement area 640. Ribbed engagement area 640 may provide an interface for frictionally securing an accessory attachment to direct access portion 632. For example, ribbed engagement area 640 may be formed of a resilient material, such as a rubber or polymer, and may include an annular groove (or grooves) 642 formed therein. A corresponding rib (or ribs) in an engagement portion of the accessory to be attached may matingly engage groove 642 to secure the accessory to port 632.

As shown, ribbed engagement area 640 may include an opening 644 therethrough that corresponds with bore 638 in projection region 636. In some embodiments, opening 644 may have a larger diameter than bore 638 and may include one or more tapered portions for facilitating insertion of a contact probe into bore 638.

As shown in FIG. 6A, projection region 636 may extend a distance D1 from an adjacent outer surface of conductor receiving end 604 to provide sufficient isolation between semi-conductive outer shield 626 and opening 644 when opening 644 is uncovered (e.g., when no cap or accessory is mounted to direct access port 632). An exemplary distance D1 may be in the range of 1.25 to 2.5 inches.

Conductor receiving end 604 of power cable elbow connector 600 may be configured to receive a prepared end of power cable 606 therein. For example, a forward end of power cable 606 may be prepared by connecting power cable 606 to a conductor spade assembly 646. More specifically, conductor spade assembly 646 may include a rearward sealing portion 648, a crimp connector portion 650, and a spade portion 652.

Rearward sealing portion 648 may include an insulative material surrounding a portion of power cable 606 about an opening of conductor receiving end 604. When conductor spade assembly 646 is positioned within connector body 602, rearward sealing portion 648 may seal an opening of conductor receiving end 604 about power cable 606.

Crimp connector portion 650 may include a substantially cylindrical conductive assembly configured to receive a center conductor (not shown) of power cable 606 therein. Crimp connector portion 650 may be crimped onto the center conductor prior to insertion of cable 606 into conductor receiving end 604.

Spade portion 652 may be conductively coupled to crimp connector portion 650 and may extend axially therefrom within bore 612. For example, in some implementations, spade portion 652 may be formed integrally with crimp connector portion 650 and be made of a conductive metal, such as steel, brass, aluminum, etc. As shown in FIG. 6A, spade portion 652 may include a bore 654 extending perpendicularly therethrough. Upon insertion of prepared cable 606 into power cable elbow connector 600, spade portion 652 may extend into contact area 624, with bore 654 aligned with bores 614 and 618 in first and second T-ends 608/610, respectively. Once spade portion 652 is seated within contact area 624, bore 654 may allow a threaded stud or other coupling element (e.g., a pin, rod, bolt, etc.) to conductively couple spade portion 654 to bushings or other equipment positioned within first and second T-ends 608/610.

Figure 6B:
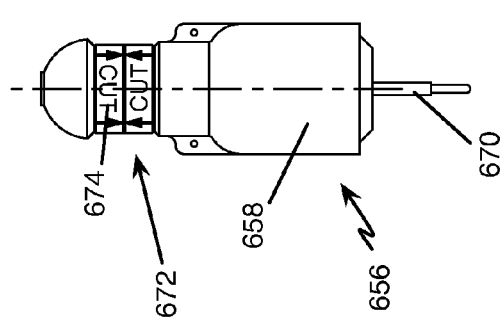
FIG. 6B is a side view of the sacrificial cap of FIG. 6A.
Figure 6C:
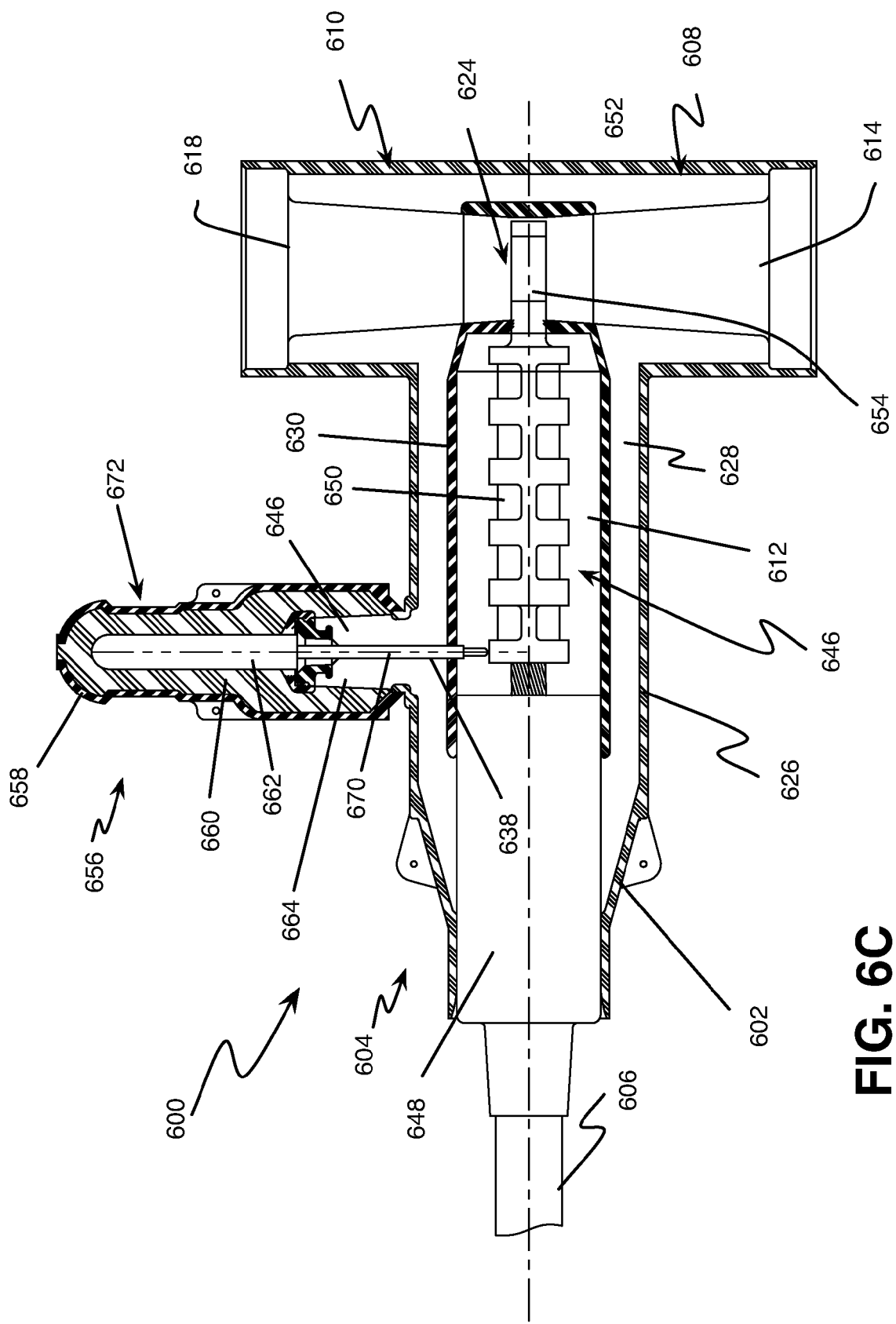
FIG. 6C is a schematic cross-sectional diagram illustrating the power cable elbow connector of FIG. 6A in an assembled state.

Consistent with implementations described herein, a sacrificial probe assembly 656 may be mounted to power cable elbow connector 600 via direct access port 632. FIG. 6B is a side view of sacrificial probe assembly 656. FIG. 6C is a cross-sectional diagram illustrating power cable elbow connector 600 in an assembled configuration in which sacrificial probe assembly 656 is mounted to direct access port 632.

As shown in FIG. 6A, sacrificial probe assembly 656 may include an EPDM outer shield 658 and an insulative inner housing 660, typically molded from an insulative rubber or epoxy material. Sacrificial probe assembly 656 also includes a sacrificial conductor 662 embedded within a portion of housing 660. Sacrificial probe assembly 656 may include a generally cylindrical or frustoconical cavity 664 therein for receiving projection region 636 of direct access port 632.

As shown in FIG. 6A, cavity 664 may include an engagement portion 666 formed therein for engaging corresponding ribbed engagement area 640 of direct access port 632. For example, engagement portion 666 may include one or more resilient annular ribs or rings 668 that engage groove(s) 642 in ribbed engagement area 640 during mounting of sacrificial probe assembly 656 to power cable elbow connector 600.

Consistent with implementations described herein, sacrificial probe assembly 656 may include a contact probe 670 conductively coupled to sacrificial conductor 662 and projecting through cavity 664. In some implementations, contact probe 670 may be integrally formed with sacrificial conductor 662. As shown in FIG. 6A, contact probe 670 may extend a distance D2 beyond a lower surface of sacrificial conductor 662. Distance D2 corresponds to a distance between engagement area 640 in direct access port 632 and an outer surface of power cable 606 (e.g., an outer surface of crimp connector portion 650), thus allowing contact probe 670 of installed sacrificial probe assembly 656 to conductively engage a portion of power cable 606. In some embodiments, contact probe 670 may be resiliently connected to sacrificial conductor 662, such as via a conductive spring, etc., thus allowing varying sizes or diameters of power cables 606 to be used with a particular sacrificial probe assembly 656.

In one implementation, a cut-through region 672 may be provided in a portion of sacrificial probe assembly 656 in a region overlying at least a portion of sacrificial conductor 662. In some implementations, indicia 674 relating to cut-through region 672 may be provided on a surface of outer shield 658, as shown in FIG. 6B, for indicating that a user is to cut through sacrificial probe assembly 656 at cut-through region 672.

When it is necessary for work to be performed on power cable 606 (or devices connected to power cable 606), a worker may cut through sacrificial probe assembly 656 at cut-through region 672 (e.g., with a grounded hydraulic cable cutter, or similar tool) to ensure that the electrical system that connector 600 is connected to has been properly de-energized and is, therefore, safe to work on. When it is time to reenergize connector 600, the damaged (i.e., severed) sacrificial probe assembly 656 may be removed and a new or replacement sacrificial probe assembly may be installed.

Figure 7:
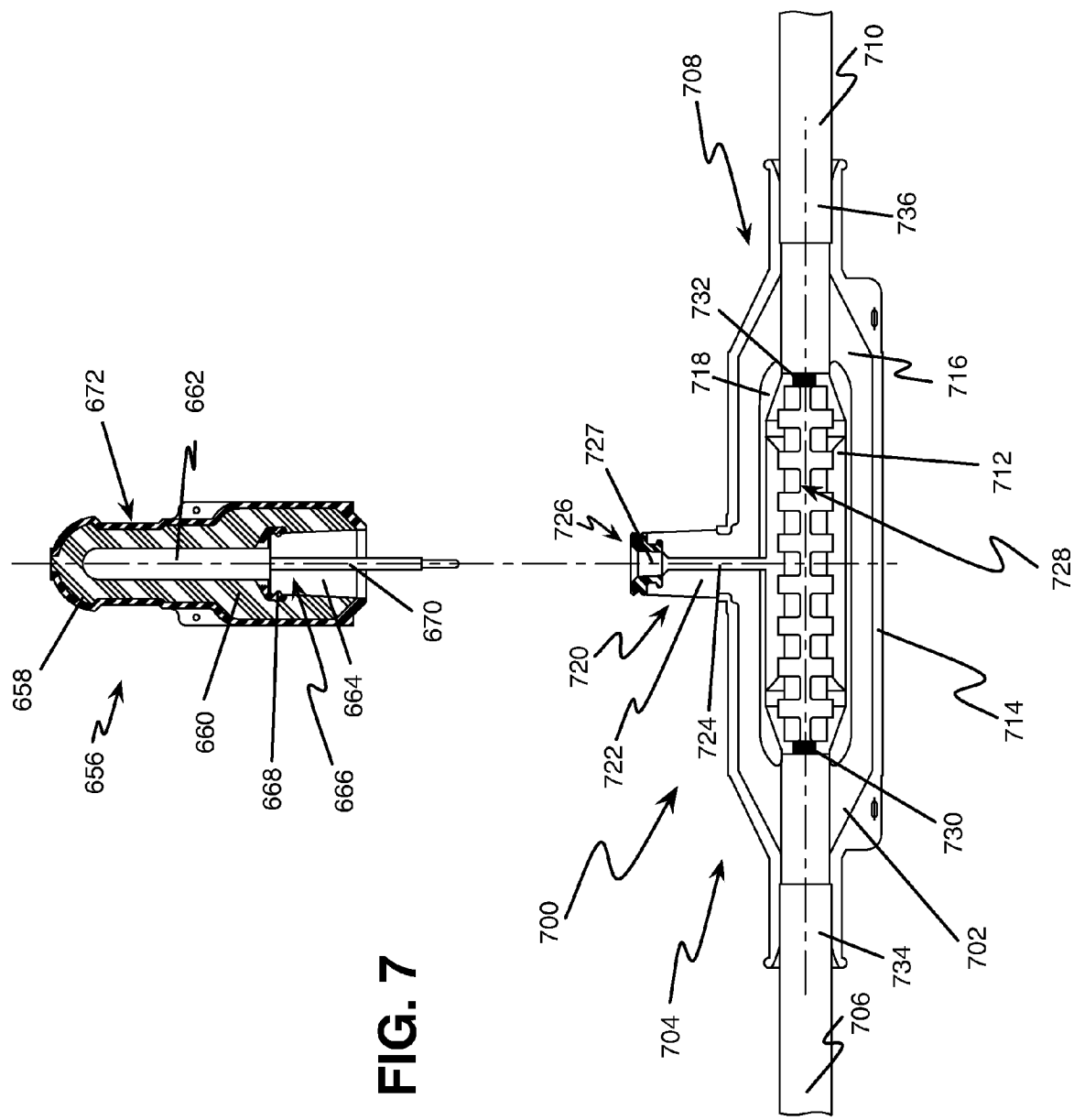
FIG. 7 is a is a schematic cross-sectional diagram illustrating a power cable splice connector consistent with implementations described herein.

FIG. 7 is an exploded cross-sectional diagram illustrating a power cable splice connector 700 for use with sacrificial probe assembly 656 described above. As shown, power cable splice connector 700 may include a main housing body 702 that includes a first conductor receiving end 704 for receiving a first power cable 706 therein and a second conductor receiving end 708 for receiving a second power cable 710. First and second conductor receiving ends 704/708 may extend along a main axis of splice connector 700. In addition, splice connector 700 may include a longitudinal bore 712 extending therethrough from first conductor receiving end 704 to second conductor receiving end 708.

Power cable splice connector 700 may include an electrically conductive outer shield 714 formed from, for example, EPDM. Within shield 714, power cable splice connector 700 may include an insulative inner housing 716, typically molded from an insulative rubber or epoxy material. Within insulative inner housing 716, power cable splice connector 700 may include a conductive or semi-conductive insert 718 that surrounds the connection portions of power cables 706 and 710.

Consistent with embodiments described herein, power cable splice connector 700 may include a direct access interface port 720 that provides a direct port to a conductor of spliced power cables 706/710 via bore 712 in splice connector 700. As described below, direct access interface port 720 may be configured to allow sacrificial probe assembly 656 to directly engage and interface with a conductor of spliced power cables 706/710.

For example, as illustrated in FIG. 7, direct access port 720 may include a projection region 722 that projects substantially perpendicularly from the main axis of splice connector 700 in a region that overlies at least a portion of spliced power cables 706/710. As shown, projection region 722 may be formed integral with insulative inner housing 716 and may extend through an opening within outer shield 714. In some implementations, projection region 722 may be frustoconically or cylindrically shaped to provide for a frictional engagement with sacrificial probe assembly 656.

As shown in FIG. 7, projection region 722 may include a bore 724 therethrough that communicates with bore 712 in splice connector 700. Inner insert 718 may include an opening that corresponds with bore 712 to provide access to bore 712. Bore 724 in projection region 722 may allow contact probe 670 of sacrificial probe assembly 656 to extend into bore 712 and come into contact with a conductor of spliced power cables 706/710.

Similar to projection region 636 described above with respect to FIG. 6A-6C, an upper surface of projection region 722 may include a ribbed engagement area 726 to enable sacrificial probe assembly 656 to be frictionally secure to direct access portion 720. Ribbed engagement area 726 may include an opening 727 therethrough that corresponds with bore 724 in projection region 722.

Conductor receiving ends 704/708 of power cable splice connector 700 may be configured to receive power cables 706/710 therein. For example, power cable splice connector 700 may be slid along a length of one of power cables 706/710 prior to splicing of the cables. Power cable 706 may be spliced to power cable 710 with a crimp connector 728 or similar connector. Crimp connector 728 may include a substantially cylindrical conductive assembly configured to receive a center conductors 730/732 of power cables 706/710 therein. Crimp connector 728 may be crimped onto the center conductors 730/732.

Power cables 706/710 may be further prepared to include respective rearward sealing portions 734/736. Rearward sealing portions 734/736 may include an insulative material surrounding a portion of power cables 706/710. When crimp connector 728 is positioned within connector body 702, rearward sealing portions 734/736 may seal openings in first and second conductor receiving ends 704/708 about power cables 706/710.

Following splicing with crimp connector 728, power cable splice connector 700 may be slid along the cables until the splice is centrally positioned within splice connector 700.

Sacrificial probe assembly 656 may be mounted to direct access port 720 in a manner similar to that described above with respect to FIGS. 6A-6C, thereby placing contact probe 670 into conductive contact with crimp connector 728.

When it is necessary for work to be performed on power cables 706/710 (or devices connected to power cables 706/710), a worker may cut through sacrificial probe assembly 656 at cut-through region 672 to ensure that the electrical system that splice connector 700 is connected to has been properly de-energized and is, therefore, safe to work on. When it is time to reenergize splice connector 700, the damaged (i.e., severed) sacrificial probe assembly 656 may be removed and a new or replacement sacrificial probe assembly may be installed.

Figure 8:
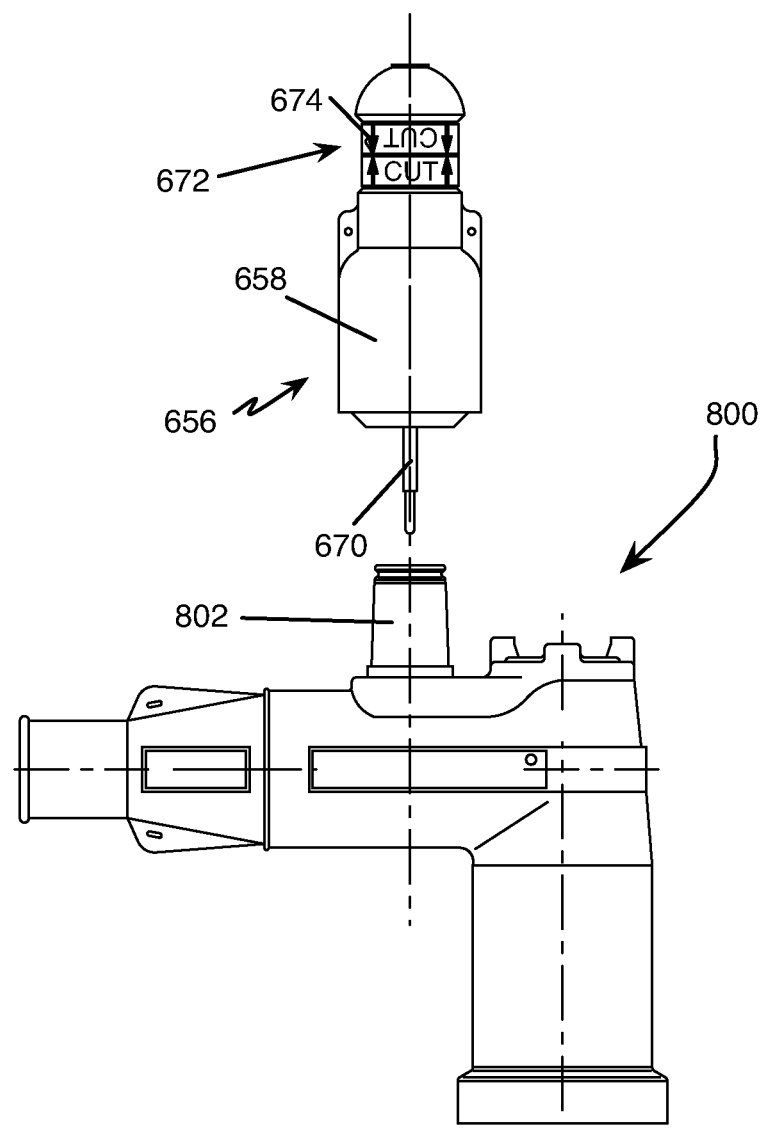
FIG. 8 is a side view illustrating another power cable elbow connector consistent with implementations described herein.

FIG. 8 is a side view of another exemplary power cable connector for use with the sacrificial probe assembly described herein. More specifically, FIG. 8 illustrates a load-break elbow connector 800 having a direct access port 802 formed therein. Similar to direct access port 602 on power cable elbow connector 600 described above, direct access port 802 provides an access to conductor of an installed power cable. Sacrificial probe assembly 656 may be installed on direct access port 802 and severed at cut-through region 672 when in is necessary to ensure that the connector has been de-energized. When work has been completed, a new sacrificial probe assembly 656 may be installed on direct access port 802.

FIG. 9A is a cross-sectional diagram illustrating an alternative sacrificial probe assembly 900 for use with direct access ports 602, 702, and/or 802 described above. As shown sacrificial probe assembly 900 may include a main body 902 having an outer shield 904 and an insulative inner housing 906. Outer shield 904 may be formed of EPDM or other semi-conductive material and inner housing 906 may be molded from an insulative rubber or epoxy material. Main body 902 may have a substantially cylindrical configuration and may have a length L1.

Inner housing 906 may include an axial bore 905 formed at least partially therethrough. As described in additional detail below, bore 905 is configured to receive a conductor probe 910 therein. As shown in FIG. 9A, inner housing 906 may include a barrier portion 908 formed at a terminus of bore 905. In one embodiment barrier portion 908 may have a length L2. Upon triggering of sacrificial probe assembly 900 (described below), conductor probe 910 pierces barrier portion 908 and projects into the bore (e.g., 638 in FIG. 6A) of direct access port (e.g., 632 in FIG. 6A) to contact a conductor of power cable 606.

Sacrificial probe assembly 900 may include a generally cylindrical or frustoconical cavity 907 therein for receiving a projection region of a coupled direct access port (e.g., region 636 in port 632 described above with respect to FIGS. 6A-6C). Cavity 907 may include an engagement portion 909 formed therein for engaging corresponding engagement area on the direct access port (e.g., engagement area 640 on port 632 described above with respect to FIGS. 6A-6C). For example, engagement portion 909 may include one or more resilient annular ribs or rings 911 that engage corresponding groove(s) in the connected direct access port.

As shown in FIG. 9A, sacrificial probe assembly 900 may include a probe trigger assembly 912 projecting from an upper surface of main body 902 and embedded at least partially therein. Probe trigger assembly 912 may include a trigger housing 914, conductor probe 910, a drive piston 916, an explosive actuator 918, a ground conductor 920, and triggering wires 922.

In one implementation, trigger housing 914 may be formed of a conductive material, such as copper or aluminum, and may have a central cavity 915 formed therein. Trigger housing 914 may have a cylindrical configuration having a smaller diameter than that of main body 902. Trigger housing 914 may have a length L3, as shown in FIG. 9A, to accommodate a length of conductor probe 910 in a retracted position (e.g., prior to penetration through barrier portion 908, as described above). Trigger housing 914 may be conductively coupled to ground via ground conductor 920 secured to trigger housing 914.

Explosive actuator 918, drive piston 916 and conductor probe 910 are mounted within cavity 915 in trigger housing 914 and operate, upon command (e.g., electrically received via triggering wires 922), to drive conductor probe 910 through barrier portion 908 in inner housing 906 and into the bore in the direct access port of the attached connector to contact its conductor. In some implementations, triggering wires 922 may facilitate detonation of explosive actuator 918 in an area proximate to assembly 900. In other embodiments, triggering wires 922 may facilitate remote detonation, e.g., via a network connection. As shown, conductor probe 910 may include pointed end 924 for piercing barrier portion 908.

Drive piston 916 is conductively coupled to conductor probe 910 and to trigger housing 914 via engagement between drive piston 916 and trigger housing 914 in cavity 915. For example, drive piston 916 and conductor probe 910 may be formed of a conductive material, such as copper or aluminum.

Explosive actuator 918 may include an explosive material or fluid and a detonator or charge portion. Activation of the detonator via a signal or charge transmitted via triggering wires 922 causes the explosive material to combust, thereby driving drive piston 916 toward main body 902 of sacrificial probe assembly. In exemplary implementations, an explosive force resulting from combustion of the explosive material or fluid is sufficient to cause conductor probe 910 to pierce barrier portion 908 but insufficient to damage or otherwise destroy trigger housing 914.

As drive piston 916 moves within cavity 915 (e.g., following activation of explosive actuator 918), pointed end 924 of conductive probe 910 pierces barrier portion 908 of inner housing 906 and extends into the bore of the attached direct access port and into contact with a conductor of a power cable installed therein. Since conductor probe 910, drive piston 916 and trigger housing 914 are each conductively coupled, contact of conductor probe 910 with the power cable conductor creates a conductive path to ground.

When it is necessary for work to be performed on devices or cables that are conductively coupled to sacrificial probe assembly 900, explosive actuator 918 is activated, causing drive piston 916 to move downwardly within cavity 915, and causing conductor probe 610 to pierce barrier portion 908 and extend into contact with a conductor of the connector. If the connector is properly de-energized, this operation may be performed without current traveling to ground via sacrificial probe assembly 900. However, if the connector is not properly de-energized, current may travel via conductor probe 910 to ground via drive piston 916 and trigger housing 914.

When it is time to reenergize the attached connector, the used sacrificial probe assembly 900 may be removed and a new or replacement sacrificial probe assembly may be installed.

FIG. 9B is a cross-sectional diagram illustrating an alternative sacrificial probe assembly 900 consistent with embodiments described herein. As shown, in contrast to the embodiment shown in FIG. 9A, barrier portion 908 of inner housing 906 is replaced with a gel insert 950. In one implementation, gel insert 950 may include a gel-retaining membrane 952 and an insulated gel 955 having a viscosity or density less than that of inner insulative housing 906. Thus, a force or charge necessary to drive conductor probe 910 through gel insert 950 may be less than that required to drive conductor probe 910 through barrier portion 908 of inner housing 906. Gel-retaining membrane 952 may retain gel 955 within gel insert 905 and prevent gel 955 from leaking out of cavity 907.

In one implementation, inner housing 906 may include a gel cavity 960 formed between bore 908 and access port engagement cavity 907. Gel insert 950 may be inserted into gel cavity 960 during manufacture or assembly of sacrificial probe assembly 900.

In other implementations, insulated gel 955 may have a higher viscosity or density. In such implementations, a gel-retaining membrane 952 may not be necessary to retain insulated gel 955 within gel cavity 960.

Figure 10B:
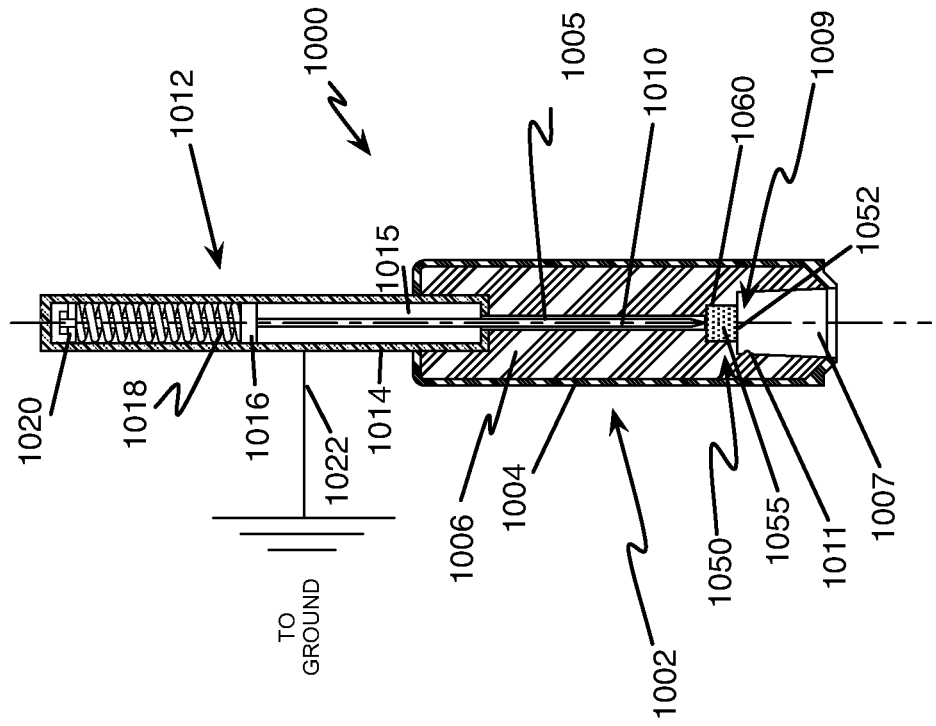
FIGS. 10A and 10B are cross-sectional diagram of still other embodiments of the sacrificial assembly of FIG. 9A.
Figure 10A:
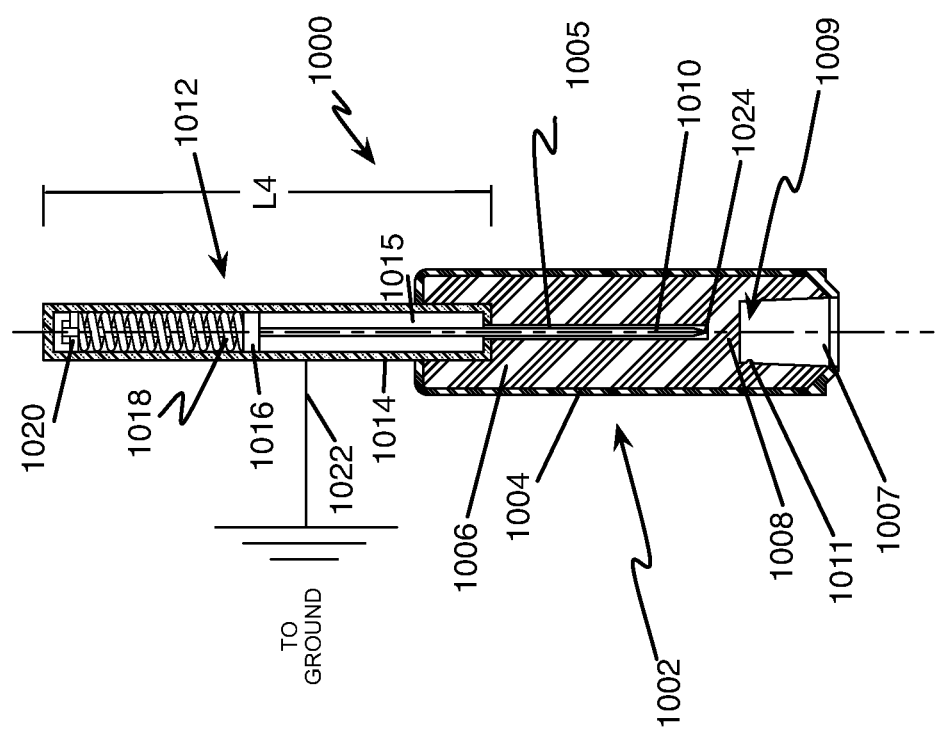

FIG. 10A is a cross-sectional diagram illustrating still another alternative sacrificial probe assembly 1000 for use with direct access ports 602, 702, and/or 802 described above. As shown sacrificial probe assembly 1000 may include a main body 1002 similar to main body 902 described above with respect to FIG. 9. Main body 1002 includes an outer shield 1004 and an insulative inner housing 1006.

Inner housing 1006 includes axial bore 1005 configured to receive a conductor probe 1010 therein. In one embodiment, inner housing 1006 further includes a barrier portion 1008 formed at a terminus of bore 1005. Upon triggering of sacrificial probe assembly 1000 (described below), conductor probe 1010 pierces barrier portion 1008 and projects into the bore (e.g., 638 in FIG. 6A) of direct access port (e.g., 632 in FIG. 6A) to contact a conductor of a power cable installed therein.

Sacrificial probe assembly 1000 may include a generally cylindrical or frustoconical cavity 1007 therein for receiving a projection region of a coupled direct access port. Cavity 1007 includes an engagement portion 1009 formed therein for engaging corresponding engagement area on the direct access port.

In contrast to the embodiment described in relation to FIGS. 9A and 9B, sacrificial probe assembly 1000 may include a spring-loaded probe trigger assembly 1012 projecting from an upper surface of main body 1002 and embedded at least partially therein. Spring-loaded probe trigger assembly 1012 may include a trigger housing 1014, conductor probe 1010, a drive piston 1016, a spring 1018, a spring actuator 1020, and a ground conductor 1022.

In one implementation, trigger housing 1014 may be formed of a conductive material, such as copper or aluminum, and may have a central cavity 1015 formed therein. Trigger housing 1014 may have a cylindrical configuration having a smaller diameter than that of main body 1002. Trigger housing 1014 may have a length L4, as shown in FIG. 10A, to accommodate a length of conductor probe 1010 in a retracted position and a length of spring 1018. Trigger housing 1014 may be conductively coupled to ground via ground conductor 1022 secured to trigger housing 1014.

Spring 1018, spring actuator 1020, drive piston 1016 and conductor probe 1010 are mounted within cavity 1015 in trigger housing 1014. Drive piston 1016 is conductively coupled to conductor probe 1010 and to trigger housing 1014 via engagement between drive piston 1016 and trigger housing 1014 in cavity 1015. Drive piston 1016 and conductor probe 1010 may be formed of a conductive material, such as copper or aluminum.

Prior to activation by spring actuator 1020, spring 1018 may be maintained in cavity 1015 in a compressed or biased configuration. Upon activation of spring actuator 1020, spring 1018 decompresses and drives conductor probe 1010 through barrier portion 1008 in inner housing 1006 and into the bore in the direct access port of the attached connector to contact its conductor. Spring actuator 1020 may include any suitable mechanical or electro-mechanical actuator that may be actuated by a person and that is configured to affect a release of spring 1018 upon actuation.

As drive piston 1016 moves within cavity 1015 (e.g., decompression of spring 1018), conductive probe 1010 pierces barrier portion 1008 of inner housing 1006 and extends into the bore of the attached direct access port and into contact with a conductor of a power cable installed therein. Since conductor probe 1010, drive piston 1016, and trigger housing 1014 are each conductively coupled, contact of conductor probe 1010 with the power cable conductor creates a conductive path to ground.

FIG. 10B is a cross-sectional diagram illustrating an alternative sacrificial probe assembly 1000 consistent with embodiments described herein. As shown, in contrast to the embodiment shown in FIG. 10A, barrier portion 1008 of inner housing 1006 is replaced with a gel insert 1050. Similar to gel insert 950 described above, gel insert 1050 may include a gel-retaining membrane 1052 and an insulated gel 1055 having a viscosity or density less than that of inner insulative housing 1006. Thus, a spring force necessary to drive conductor probe 1010 through gel insert 1050 may be less than that required to drive conductor probe 1010 through barrier portion 1008 of inner housing 1006. Gel-retaining membrane 1052 may retain gel 1055 within gel insert 1050 and prevent gel 1055 from leaking out of cavity 1007.

In one implementation, inner housing 1006 may include a gel cavity 1060 formed between bore 1005 and access port engagement cavity 1007. Gel insert 1050 may be inserted into gel cavity 1060 during manufacture or assembly of sacrificial probe assembly 1000.

In other implementations, insulated gel 1055 may have a higher viscosity or density. In such implementations, a gel-retaining membrane 1052 may not be necessary to retain insulated gel 1055 within gel cavity 1060.

By providing an effective mechanism for establishing demonstrative evidence of a de-energized system/circuit in an electrical connector, various personnel may be more easily able to safely identify and confirm a de-energized condition in a switchgear assembly. More specifically, consistent with aspects described herein, personnel may be able to create and view a physical disconnect of a connected portion of the electrical system without damaging (and necessarily replacing) connected power cables or other components.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, implementations described herein may also be used in conjunction with other devices, such as high voltage switchgear equipment, including 15 kV, 25 kV, or 35 kV equipment.

For example, various features have been mainly described above with respect to electrical splicing connectors. In other implementations, other medium/high voltage power components may be configured to include the sacrificial appendage/adapter configurations described above.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A device, comprising:
   a sacrificial cap configured for mounting on a direct access port of an electrical connector,
   wherein the sacrificial cap includes an insulated body and a sacrificial probe conductor projecting from the insulated body,
   wherein the sacrificial probe conductor is configured to conductively couple with a conductor in the electrical connector via the direct access port when the sacrificial cap is installed on the direct access port,
   wherein the sacrificial cap includes a portion configured to be physically severed to confirm that the electrical connector is de-energized.

2. The device of claim 1, wherein at least a portion of the sacrificial cap includes a semi-conductive outer shield.

3. The device of claim 2, wherein the at least a portion of the sacrificial cap comprises a ethylene-propylene-dienemonomer (EPDM) shield.

4. The device of claim 1, wherein the insulated body of the sacrificial cap includes an engagement portion for engaging the direct access port in the electrical connector,
   wherein the engagement portion comprises a cylindrical or frustoconical cavity for receiving a projection portion of the direct access port,
   wherein the sacrificial probe conductor extends through the engagement portion.

5. The device of claim 4, wherein the engagement portion comprises at least one resilient ring for engaging a corresponding groove in the projection portion of the direct access port.

6. The device of claim 1, wherein the sacrificial probe conductor comprises a core conductor contained within the insulated body and a conductor probe projecting from the core conductor.

7. The device of claim 1, wherein the portion configured to be physically severed comprises a cut-through portion that includes at least a portion of the sacrificial conductor probe.

8. The device of claim 7, wherein an outer surface of the sacrificial cap comprises graphical indicia indicating a location of the cut-through portion.

9. The device of claim 1, wherein the sacrificial conductor probe comprises at least a resilient portion for accommodating different size conductors in the electrical connector.

10. The device of claim 1, wherein the electrical connector comprises a power cable elbow connector or a power cable splice connector.

11. The device of claim 1, wherein the sacrificial cap is removeable from the electrical connector after assembly.

12. A device, comprising:
    a sacrificial assembly configured for mounting on a direct access port of an electrical connector,
    wherein the sacrificial assembly comprises:
       an insulated body having a bore formed at least partially therethrough;
       an injectable probe conductor retained in the bore; and
       an actuator for driving the injectable probe conductor into the direct access port to conductively connect to a conductor in the electrical connector via the direct access port when the sacrificial assembly is installed on the direct access port.

13. The device of claim 12, wherein the sacrificial assembly further comprises:
    a conductive housing projecting from the insulated body,
    wherein the conductive housing retains the actuator and at least a portion of the injectable probe conductor prior to activation.

14. The device of claim 13, wherein the conductive housing is grounded and wherein the injectable probe conductor is conductively coupled to the conductive housing.

15. The device of claim 14, wherein the sacrificial assembly comprises a drive piston mounted in the conductive housing and wherein activation of the actuator causes the drive piston to drive the injectable probe conductor into the direct access port.

16. The device of claim 15, wherein the drive piston is conductively coupled to the conductive housing and the probe conductor for creating a current pathway from the direct access port to ground.

17. The device of claim 12, wherein the insulated body comprises a barrier portion formed at a terminus of the bore, and
    wherein activation of the actuator causes the injectable probe conductor to pierce the barrier portion and project into the direct access port.

18. The device of claim 12, wherein the sacrificial assembly further comprises:
    an insulated gel insert positioned at a terminus of the bore,
    wherein activation of the actuator causes the injectable probe conductor to pierce the insulated gel insert and project into the direct access port.

19. The device of claim 12, wherein the insulated body of the sacrificial assembly includes an engagement portion for engaging the direct access port in the electrical connector,
    wherein the engagement portion comprises a cylindrical or frustoconical cavity for receiving a projection portion of the direct access port,
    wherein, upon activation of the actuator, the injectable probe conductor projects through the engagement portion into the direct access port.

20. The device of claim 12, wherein the actuator comprises one of an explosive actuator or a spring-based actuator.

21. The device of claim 12, further comprising:
    the electrical connector,
    wherein the electrical connector comprises one of a power cable elbow connector or a splice connector.

* * * * *